United States Patent
Ishii et al.

(10) Patent No.: US 10,129,494 B2
(45) Date of Patent: Nov. 13, 2018

(54) IMAGING DEVICE, AND SOLID-STATE IMAGE SENSOR

(71) Applicant: Panasonic Intellectual Property Management Co., Ltd., Osaka (JP)

(72) Inventors: Motonori Ishii, Osaka (JP); Yutaka Hirose, Kyoto (JP); Shota Yamada, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/900,037

(22) Filed: Feb. 20, 2018

(65) Prior Publication Data

US 2018/0191975 A1    Jul. 5, 2018

Related U.S. Application Data

(63) Continuation of application No. PCT/JP2016/003845, filed on Aug. 24, 2016.

(30) Foreign Application Priority Data

Aug. 28, 2015 (JP) .................................. 2015-169672

(51) Int. Cl.
   *H04N 5/365* (2011.01)
   *H04N 5/374* (2011.01)
   *H01L 27/146* (2006.01)

(52) U.S. Cl.
   CPC ....... *H04N 5/365* (2013.01); *H01L 27/14612* (2013.01); *H01L 27/14645* (2013.01); *H04N 5/374* (2013.01)

(58) Field of Classification Search
   CPC .. H04N 5/365; H04N 5/374; H01L 27/14645; H01L 27/14612
   See application file for complete search history.

(56) References Cited

U.S. PATENT DOCUMENTS 8,922,687 B2 * 12/2014 Yarino .............. H01L 27/14609
                                                    348/294
9,344,654 B2 *  5/2016 Ishii ..................... H04N 5/3698
(Continued)

FOREIGN PATENT DOCUMENTS

JP       H06-141242 A     5/1994
JP       2004-282554 A   10/2004
(Continued)

OTHER PUBLICATIONS

International Search Report issued in Application No. PCT/JP2016/003845 dated Oct. 11, 2016, with English translation.
(Continued)

*Primary Examiner* — Padma Haliyur
(74) *Attorney, Agent, or Firm* — McDermott Will & Emery LLP

(57) ABSTRACT

An imaging device includes: a solid-state image sensor including: a plurality of pixels that are arranged in a two-dimensional array; and a signal processing device that processes an output signal from the solid-state image sensor. The imaging device generates a corrected image by: generating a correction signal based on a difference between a first temporary correction signal and a second temporary correction signal, the first temporary correction signal being obtained by directly applying a first voltage amplitude to a signal storage provided in each of the plurality of pixels, and the second temporary correction signal being obtained by applying, to the signal storage, a second voltage amplitude that is different from the first voltage amplitude; acquiring an image signal upon a photographing drive operation being performed by the solid-state image sensor; and applying the correction signal to the image signal.

8 Claims, 11 Drawing Sheets

(56) References Cited

U.S. PATENT DOCUMENTS

| | | | |
|---|---|---|---|
| 2009/0268050 A1 | 10/2009 | Tashiro et al. | |
| 2015/0172575 A1 | 6/2015 | Adachi et al. | |
| 2015/0281623 A1* | 10/2015 | Okada | H04N 5/37455 |
| | | | 348/280 |
| 2015/0288898 A1* | 10/2015 | Yazawa | H04N 5/363 |
| | | | 348/300 |

FOREIGN PATENT DOCUMENTS

| | | |
|---|---|---|
| JP | 2005-094093 | 4/2005 |
| JP | 2009-267971 A | 11/2009 |
| JP | 2010-508702 A | 3/2010 |
| JP | 2010-141791 A | 6/2010 |
| JP | 2015-128322 A | 7/2015 |
| WO | 2008/054658 A2 | 5/2008 |

OTHER PUBLICATIONS

Written Opinion issued in Application No. PCT/JP2016/003845 dated Oct. 11, 2016, with English translation.

* cited by examiner

IMAGING DEVICE, AND SOLID-STATE IMAGE SENSOR

CROSS REFERENCE TO RELATED APPLICATIONS

This application is a U.S. continuation application of PCT International Patent Application Number PCT/JP2016/003845 filed on Aug. 24, 2016, claiming the benefit of priority of Japanese Patent Application Number 2015-169672 filed on Aug. 28, 2015, the entire contents of which are hereby incorporated by reference.

BACKGROUND

1. Technical Field

The present disclosure relates to an imaging device, and a solid-state image sensor.

2. Description of the Related Art

Hereinafter, a conventional technique disclosed in Japanese Unexamined Patent Application Publication No. 06-141242 will be described with reference to FIG. 13.

In FIG. 13, reference character c indicates a solid-state image sensor element, and reference characters a and b indicate pixels, of which reference character a indicates a defective pixel. It is assumed that when the solid-state image sensor element is displaced in the horizontal pixel direction with respect to an optical image formed on the solid-state image sensor element with the use of a displacement means, the optical image is relatively moved from a to b in FIG. 13. At this time, if the readout pulse timing, which is the timing at which an electric signal is read out from the solid-state image sensor element, is changed from A to B, an optical image that should be formed on defective pixel a is formed on normal pixel b, and converted to an electric signal.

If the displacement means moves such that the optical image reciprocates between pixel a and pixel b in FIG. 13, and a timing generator circuit generates a readout pulse such that the readout pulse varies between timing A and timing B in conjunction with the movement of the displacement means, despite pixel a having a defect, pixel a is interpolated by pixel b, as a result of which the occurrence of fixed pattern noise (noise) caused by pixel a is reduced, and image variation is reduced.

However, the conventional technique disclosed in Japanese Unexamined Patent Application Publication No. 06-141242 is problematic in that it is not possible to sufficiently reduce noise, and sufficiently suppress an image failure called image roughness.

It is an object of the present disclosure to provide an imaging device that can provide an image with little variations.

SUMMARY

An imaging device according to one aspect of the present disclosure is an imaging device including: a solid-state image sensor including a plurality of pixels that are arranged in a two-dimensional array; and a signal processing device that processes an output signal from the solid-state image sensor. The imaging device generates a corrected image by: generating a correction signal based on a difference between a first temporary correction signal and a second temporary correction signal, the first temporary correction signal being obtained by directly applying a first voltage amplitude to a signal storage provided in each of the plurality of pixels, and the second temporary correction signal being obtained by applying, to the signal storage, a second voltage amplitude that is different from the first voltage amplitude; acquiring an image signal upon a photographing drive operation being performed by the solid-state image sensor; and applying the correction signal to the image signal.

For example, the plurality of pixels may include a normal pixel and an optical black pixel. The first temporary correction signal may be obtained by directly applying a constant voltage to a signal storage provided in the optical black pixel, and the second temporary correction signal may be obtained by directly applying, to a signal storage provided in the normal pixel, a voltage amplitude corresponding to an optical signal.

For example, each of the plurality of pixels may include a reset transistor for resetting the signal storage by using an applied voltage applied from outside of the each of the plurality of pixels. The imaging device may obtain the first temporary correction signal and the second temporary correction signal by making a change to a voltage applied to the reset transistor, with the reset transistor being turned on, and calculating a difference in an output signal from the each of the plurality of pixels between before and after the change.

An imaging device according to one aspect of the present disclosure is an imaging device including: a solid-state image sensor including a plurality of pixels that are arranged in a two-dimensional array; and a signal processing device that processes an output signal from the solid-state image sensor. The imaging device generates a quantum efficiency corrected image by: capturing (1) a first image signal obtained by photographing an object and (2) a second image signal obtained through photographing performed such that, with respect to the object imaged on the solid-state image sensor at a time of photographing the object, the object is imaged on the solid-state image sensor by being moved in a horizontal direction or a vertical direction by an amount equal to an integer number of pixels of 1 or more; calculating a quantum efficiency correction factor by using the first image signal and the second image signal; and applying the quantum efficiency correction factor to an image signal obtained under an arbitrary photographing condition.

For example, the imaging device may acquire the image signal including n image signals, where n is an integer of 2 or more, generate a super-resolution image by using the correction signal and the n image signals, after the correction signal has been generated and a first one of the n image signals has been acquired, acquire a second one of the n image signals simultaneously with a step of generating a corrected image corresponding to the first one of the n image signals, and acquire a k-th one of the n image signals simultaneously with a step of generating a corrected image corresponding to a (k−1)th one of the n image signals, where k is an integer from 3 to n.

For example, the signal processing device may include a storage device. The signal processing device may store the correction signal in the storage device and generate a corrected image by applying the correction signal stored in the storage device to the image signal, and output the corrected image to a calculator.

For example, the imaging device may further include a calculator that processes an output signal from the signal processing device, and outputs an image. When the image signal and the correction signal are input to the calculator via the signal processing device, the calculator may generate the corrected image by applying the correction signal to the image signal.

A solid-state image sensor according to one aspect of the present disclosure is a solid-state image sensor for use in an imaging device, the imaging device including a solid-state image sensor, and a signal processing device that processes an output signal from the solid-state image sensor, wherein the imaging device generates a corrected image by generating a correction signal based on a difference between a first temporary correction signal and a second temporary correction signal, the first temporary correction signal being obtained by directly applying a first voltage amplitude to a signal storage in each of a plurality of pixels, and the second temporary correction signal being obtained by applying, to the signal storage, a second voltage amplitude that is different from the first voltage amplitude, and applying the correction signal to an image signal, and the solid-state image sensor including the plurality of pixels that are arranged in a two-dimensional array, and acquiring the image signal by performing a photographing drive operation.

Generic or specific aspects of the present disclosure may be implemented by a system, a method, an integrated circuit, a computer program, or a computer readable recording medium such as a CD-ROM, or may be implemented by any combination of a system, a method, an integrated circuit, a computer program, and a recording medium.

According to the present disclosure, it is possible to provide an image with little variations.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, imaging devices according to embodiments of the present disclosure will be described with reference to the drawings. Note that the embodiments described below show specific examples of the present disclosure. Accordingly, the numerical values, shapes, materials, structural elements, the arrangement and connection of the structural elements, and the like are merely examples, and therefore are not intended to limit the scope of the present disclosure.

Embodiment 1

Figure 1:
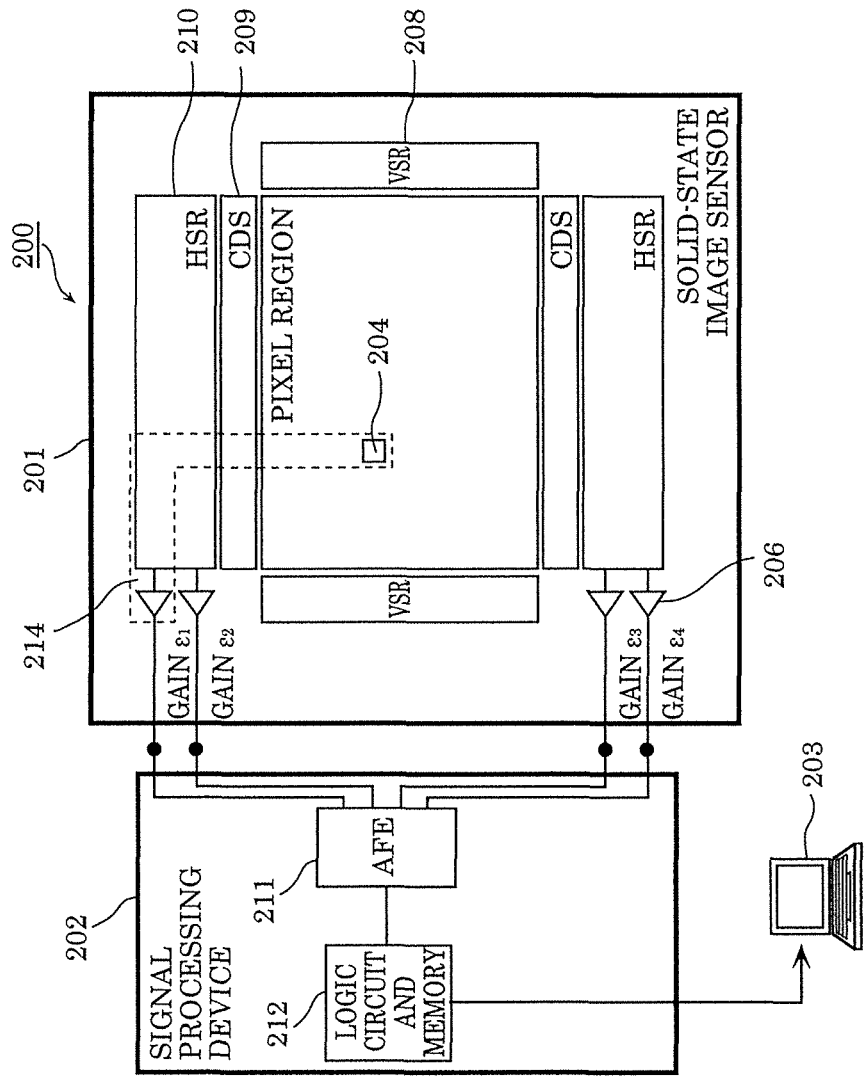
FIG. 1 is a diagram showing an imaging device according to Embodiment 1.
Figure 2:
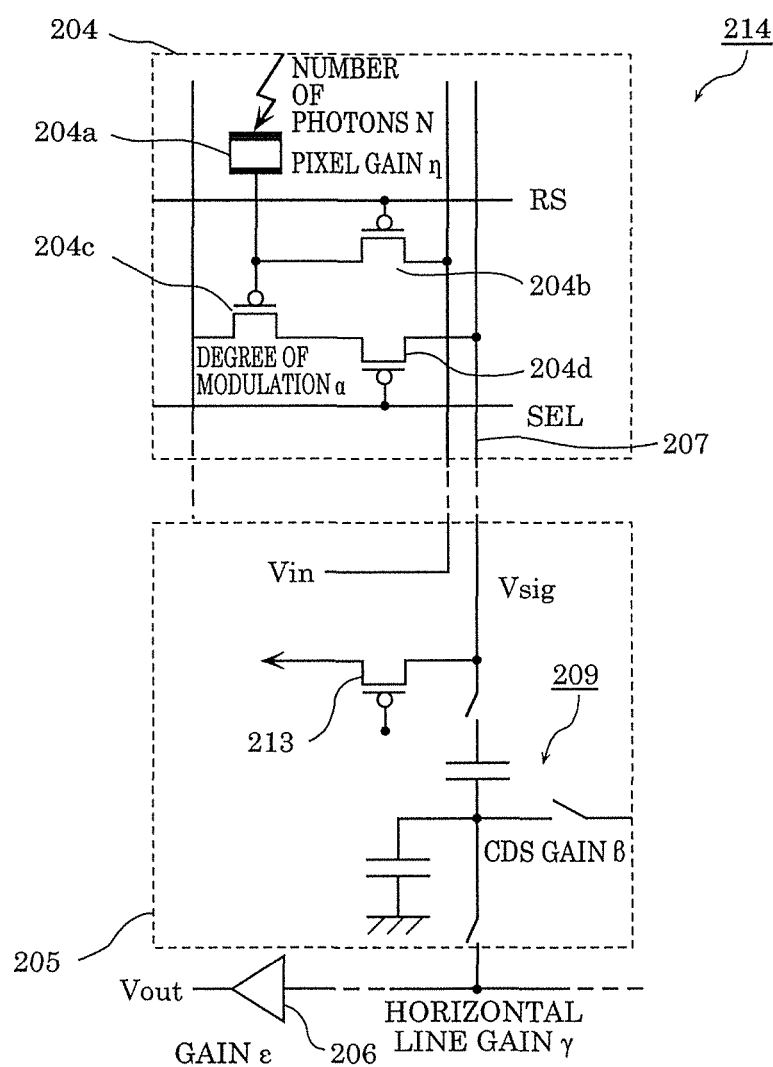
FIG. 2 is a diagram showing, in detail, a signal output path of a solid-state image sensor according to Embodiment 1.

First, a configuration of imaging device 200 according to the present embodiment will be described. FIG. 1 is a block diagram of imaging device 200 according to the present embodiment. FIG. 2 is a diagram showing signal output path 214 of one pixel 204 shown in FIG. 1.

Imaging device 200 shown in FIG. 1 includes solid-state image sensor 201, signal processing device 202, and calculator 203.

Solid-state image sensor 201 includes a plurality of pixels 204 that are arranged in a two-dimensional array in a pixel region, a plurality of column circuits 205 that are arranged in a one-dimensional array, and a plurality of output amplifiers 206 for outputting output signals of column circuits 205 to the outside.

Signal processing device 202 processes an output signal of solid-state image sensor 201. Typically, signal processing device 202 includes analog front end IC 211 (AFE) that converts an analog output signal of solid-state image sensor 201 to a digital signal, a logic circuit that performs black level and color balance adjustment and the like, and memory 212. An output signal of signal processing device 202 is output to calculator 203 (typically a PC), and subjected to further signal processing, and thereafter output to a display device or stored as an image file in a storage device.

Imaging device 200 does not need to include calculator 203.

Next, solid-state image sensor 201 will be described in detail. As shown in FIG. 2, pixel 204 includes photoelectric converter 204a, reset transistor 204b, amplifier transistor 204c, and selection transistor 204d.

Photoelectric converter 204a converts light incident on pixel 204 to an electric charge. The electric charge is stored in a signal storage (not shown in FIG. 1, a capacitance at the gate of amplifier transistor 204c) that is a storage capacitor connected to the gate of amplifier transistor 204c, and converted to a voltage signal by amplifier transistor 204c. The voltage signal is output to column circuit 205 via selection transistor 204d and vertical signal line 207.

Also, photoelectric converter 204a is formed by using, for example, a photoelectric conversion film. The photoelectric conversion film is made of an organic material, an inorganic material or the like that converts light to an electric charge with high efficiency. There is no particular limitation on the material of the photoelectric conversion film, but the photoelectric conversion film may be made of, for example, an organic material. In the case where a photodiode is used, it is necessary to adjust the thickness and shape of the photodiode according to the wavelength band of incident light that needs to be received. On the other hand, a photoelectric conversion element that uses an organic photoelectric conversion film has a high light absorptance. Accordingly, even if the thickness of the photoelectric conversion film is reduced (typically to about 0.5 μm), it is possible to achieve a higher level of sensitivity than that of a Si photodiode. Furthermore, even if, as a result of the thickness of the photoelectric conversion film being reduced, light is obliquely incident on each pixel, because the propagation distance within the photoelectric conversion film is short (approximately equal to or less than the wavelength), the light does not propagate to adjacent pixels. That is, it is possible to receive light with low cross talk. Accordingly, it is possible to achieve an optical system that has a wide light acceptance angle.

However, photoelectric converter 204a is not limited to the photoelectric conversion film, and may be any other photoelectric converter (for example, a photodiode formed by introducing an impurity into a semiconductor substrate).

As shown in FIG. 2, one column circuit 205 is a circuit that processes a voltage signal from pixel 204, and typically includes current source transistor 213 for amplifier transistor 204c, and correlated double sampling (CDS) circuit 209. CDS circuit 209 subtracts a reset voltage from a signal voltage that is the voltage signal from pixel 204, and outputs the obtained signal voltage to horizontal transfer (HSR) circuit 210. In FIG. 2, among CDS circuits 209 shown in FIG. 1, CDS circuit 209 for one column is shown.

Output amplifier 206 amplifies the signal voltage input via HSR circuit 210, and outputs the obtained signal to the outside of solid-state image sensor 201.

Note that solid-state image sensor 201 according to the present embodiment is not limited to the configuration described above.

Figure 3:
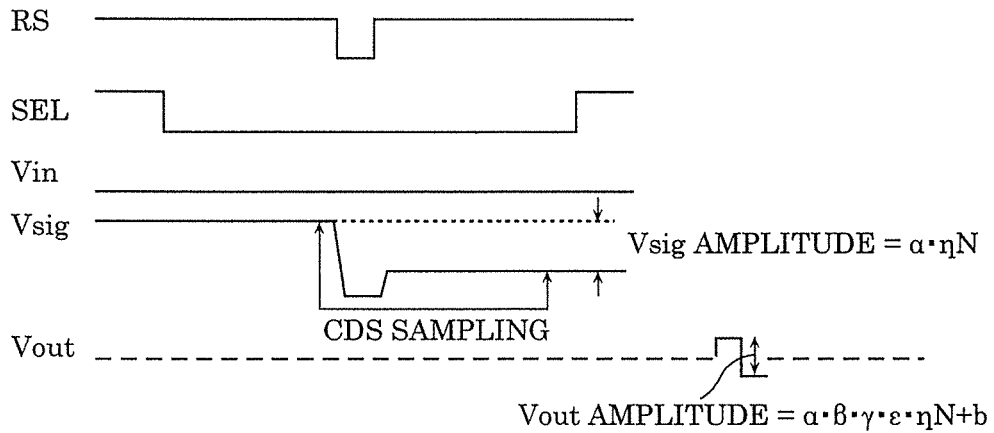
FIG. 3 is a diagram showing an operation performed by the imaging device according to Embodiment 1.

Next, an operation performed by imaging device 200 according to the present embodiment will be described with reference to FIG. 3. FIG. 3 shows only a period in which pixel 204 is selected by vertical scanning (VSR) circuit 208.

First, in response to signal SEL being turned on, vertical signal line voltage Vsig reaches a voltage level (referred to as voltage a) corresponding to the electric charge generated by photoelectric conversion. After that, in response to reset signal RS being turned on, reset transistor 204b is turned on, and the storage capacitor is reset.

In response to reset signal RS being turned off, the reset voltage (referred to as voltage b) appears in vertical signal line voltage Vsig. Next, CDS circuit 209 in column circuit 205 subtracts voltage b from voltage a, and thereby obtains Vsig amplitude. Vsig amplitude is amplified, and a voltage signal to which given constant offset value b has been added appears as output voltage Vout of output amplifier 206.

During the process from the incidence of light to output amplifier 206, the value on which variations of each portion are superimposed appears as Vout, and thus in an image obtained through subsequent signal processing device 202 and calculator 203, image roughness occurs due to the variations.

In order to quantitatively consider the image roughness, the following constants are defined. The number of photons incident on given pixel 204 is represented by N. The quantum efficiency of photoelectric converter 204a is represented by $\eta$. The degree of modulation of amplifier transistor 204c is represented by $\alpha$.

In this case, Vsig amplitude that is sampled by CDS circuit 209 is represented by $\alpha \cdot \eta N$. Furthermore, the gain of CDS circuit 209 is represented by $\beta$, the gain on a horizontal line is represented by $\gamma$, and the gain of output amplifier 206 is represented by $\varepsilon$.

In this case, with respect to a pixel of interest, output voltage Vout that is the final output signal of solid-state image sensor 201 is represented by $\alpha \cdot \beta \cdot \gamma \cdot \varepsilon \cdot \eta \cdot N + b$.

Here, b represents offset voltage, which is determined by the characteristics of output amplifier 206. Normally, in order to remove offset voltage b, optical black (OB) pixels are provided in a solid-state image sensor. The OB pixels are shielded from light by metal traces or the like, and thus the number of incident photons N is 0. Accordingly, voltage b appears as Vout.

By subtracting this voltage from output voltage Vout of the pixel of interest, an image signal voltage that is a signal proportional to the number of incident photons N can be obtained from the following (Equation 1).

$$\text{Image signal voltage} = \alpha \cdot \beta \cdot \gamma \cdot \varepsilon \cdot \eta \cdot N \qquad \text{(Equation 1)}$$

Image roughness occurs as a result of the above-described gains, or in other words, $\alpha \cdot \beta \cdot \gamma \cdot \varepsilon \cdot \eta$ varying from pixel to pixel.

Here, in order to facilitate the understanding of the present disclosure, an ordinary technique (method) will be described.

An ordinary method for removing image roughness is a method in which a correction factor corresponding to each pixel is obtained from an image including roughness obtained by applying uniform light to the solid-state image sensor in advance (the image will be uniform if there are no variations of each portion).

That is, if a light source or an object in which the number of photons N that is the number of photons incident on each pixel is known can be prepared, it is possible to obtain $\alpha \cdot \beta \cdot \gamma \cdot \varepsilon \cdot \eta$ for each pixel from the above equation.

In the case of imaging an object in which the number of photons N is unknown, image roughness can be removed by dividing the image output signal voltage by $\alpha \cdot \beta \cdot \gamma \cdot \varepsilon \cdot \eta$ obtained here.

However, this method is problematic in that the method cannot be used in the case where the number of photons N of the light source or object is not known, or in the case where solid-state image sensor 201 has been installed in an optical system in which the light source or object cannot be replaced by a light source or object in which the number of photons N is known.

Figure 4:
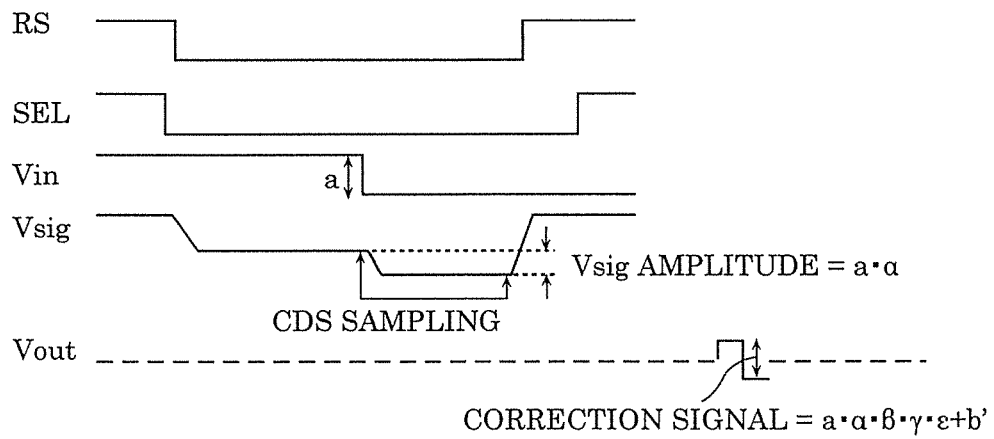
FIG. 4 is a diagram illustrating an ordinary method.

Next, another ordinary method will be described with reference to FIG. 4. FIG. 4 shows an operation sequence according to the ordinary method. FIG. 4 shows only a period in which pixel 204 is selected by VSR circuit 208, as in FIG. 3.

First, selection transistor 204d is turned on by SEL signal, and in response thereto, reset transistor 204b is turned on by RS signal. CDS circuit 209 included in column circuit 205 samples voltage Vsig that is output to vertical signal line 207 at this time.

Next, the value of reset voltage Vin decreases by an amount equal to a. Here, it is assumed that a is known. CDS circuit 209 included in column circuit 205 samples voltage Vsig that is output to vertical signal line 207 at this time. In this way, Vsig amplitude=a·$\alpha$ is obtained.

At this time, output voltage Vout of output amplifier 206 is a·$\alpha$·$\gamma$·$\varepsilon$+b'. If offset voltage b' is 0 or very close to 0, Vout=a·$\alpha$·$\gamma$·$\varepsilon$ is obtained. Because a is known, $\alpha$·$\gamma$·$\varepsilon$ can be obtained for each pixel. By dividing (Equation 1) by $\alpha$·$\gamma$·$\varepsilon$, a corrected image signal is obtained from the following (Equation 2).

$$\text{Corrected image signal} = \eta \cdot N \qquad \text{(Equation 2)}$$

Although the image roughness caused by $\eta$ cannot be removed, the other components can be removed.

However, the ordinary methods described above are problematic in that if offset voltage b' is not known, it is not possible to perform a correction. Also, because the operation sequence at the time of imaging (FIG. 3) and the operation sequence of this method (FIG. 4) are different, offset voltage b and offset voltage b' may not match. The main reason that offset voltage b and offset voltage b' do not match is because offset voltage b contains a dark current component at the time of imaging. Accordingly, a problem also arises in that it is difficult to replace b' with offset voltage b.

Imaging device 200 according to the present embodiment can solve the problems encountered with the ordinary methods described above. Hereinafter, the details will be described with reference to FIG. 5.

Figure 5:
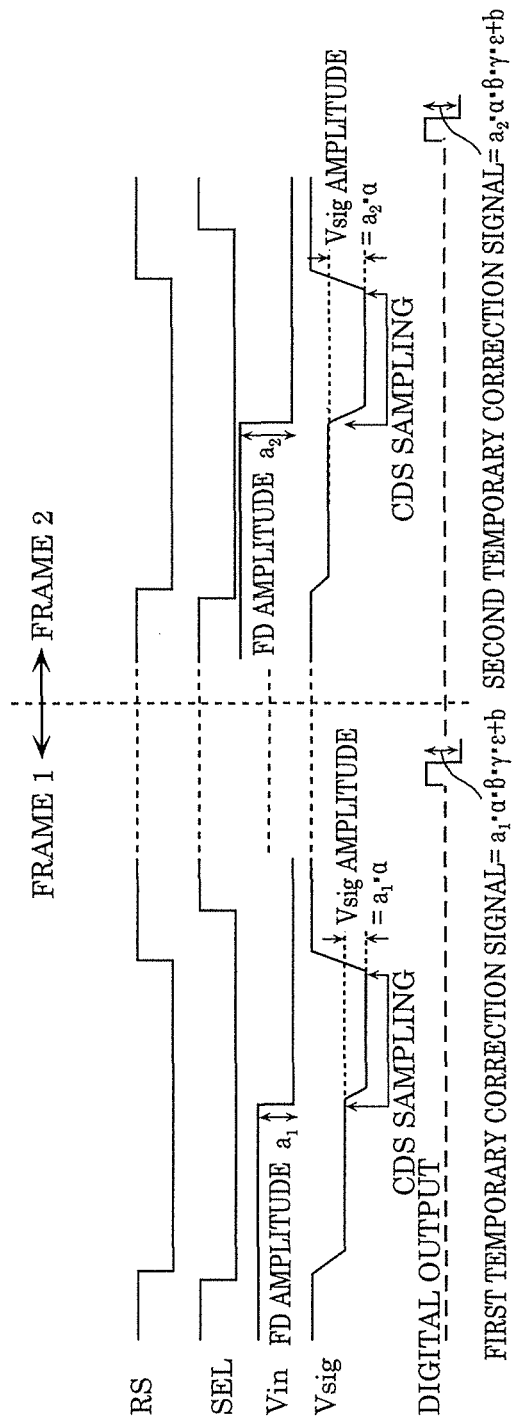
FIG. 5 is a diagram showing an operation performed by the imaging device according to Embodiment 1.

FIG. 5 is a diagram showing, in detail, an operation performed by imaging device 200 according to the present embodiment. The operation according to the present embodiment is a two-frame configuration including frame 1 and frame 2.

The method for driving frame 1 is the same as that shown in FIG. 4, except that the voltage amplitude applied to reset voltage Vin is $a_1$. A first temporary correction signal that is output voltage Vout of output amplifier 206 at this time is represented by the following (Equation 3).

$$\text{First temporary correction signal} = a_1 \cdot \alpha \cdot \gamma \cdot \varepsilon + b' \quad \text{(Equation 3)}$$

In frame 2, the voltage amplitude applied to reset voltage Vin is $a_2$. A second temporary correction signal that is output voltage Vout of output amplifier 206 at this time is represented by the following (Equation 4).

$$\text{Second temporary correction signal} = a_2 \cdot \alpha \cdot \gamma \cdot \varepsilon + b' \quad \text{(Equation 4)}$$

In order to obtain a correction signal, it is only necessary to subtract the second temporary correction signal from the first temporary correction signal, and then divide the obtained value by a known value $(a_1 - a_2)$. That is, the correction signal is obtained by the following (Equation 5).

$$\begin{aligned}\text{Correction signal} &= (\text{first temporary correction signal} - \\ &\quad \text{second temporary correction signal})/ \\ &\quad (a_1 - a_2) \\ &= \alpha \cdot \mathcal{B} \cdot Y \cdot \varepsilon\end{aligned} \quad \text{(Equation 5)}$$

By applying the correction signal to the image signal voltage represented by (Equation 1), it is possible to obtain a corrected image signal represented by (Equation 2).

That is, as described with reference to the drawings, with imaging device 200 according to the present embodiment, b' can be replaced by offset voltage b, and even if offset voltage b' is not known, image roughness can be reduced by performing a correction, and excellent image characteristics can be obtained.

Variation of Embodiment 1

Figure 6:
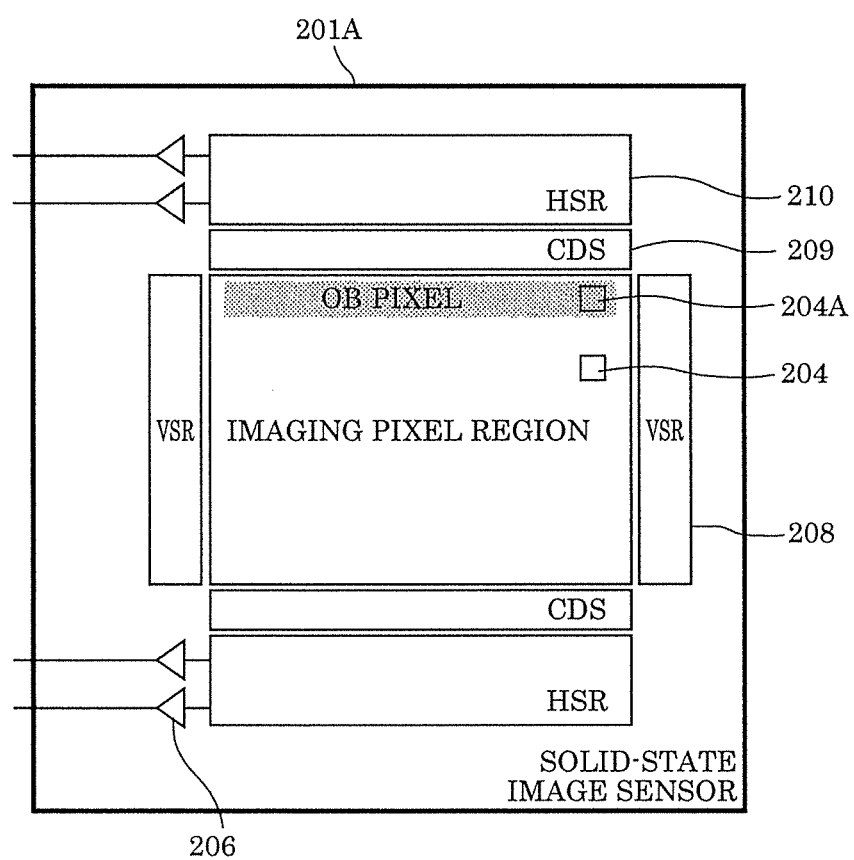
FIG. 6 is a diagram showing a solid-state image sensor according to a variation of Embodiment 1.

A variation according to the present embodiment will be described with reference to FIGS. 6 to 8. Solid-state image sensor 201A shown in FIG. 6 is different from solid-state image sensor 201 shown in FIG. 1 in that solid-state image sensor 201A includes, in addition to normal pixels 204, OB pixels 204A. OB pixels 204A are disposed in an upper or lower portion of the imaging region.

Figure 7:
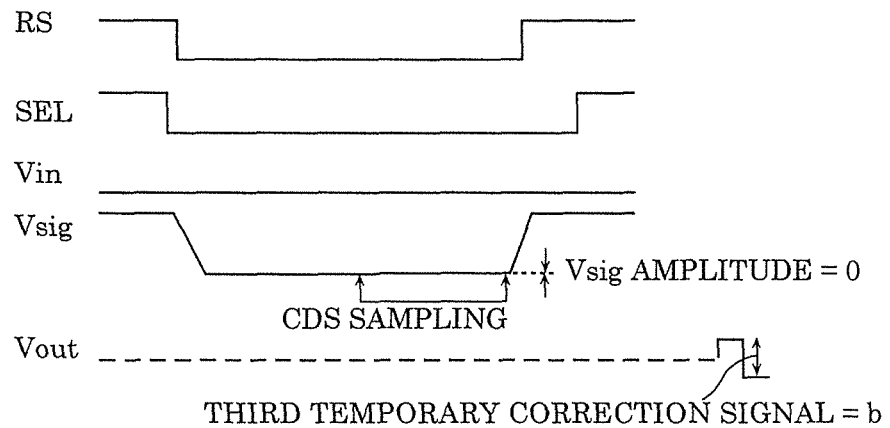
FIG. 7 is a diagram sowing an operation performed by an imaging device according to the variation of Embodiment 1.

Also, as shown in FIG. 7, in a state in which a row of OB pixels 204A is selected by VSR circuit 208, selection transistor 204d and reset transistor 204b are turned on by SEL signal and RS signal. At this time, reset voltage Vin is constant. A third temporary correction signal that is output voltage Vout from output amplifier 206 at this time is represented by the following (Equation 6).

$$\text{Third temporary correction signal} = b' \quad \text{(Equation 6)}$$

Figure 8:
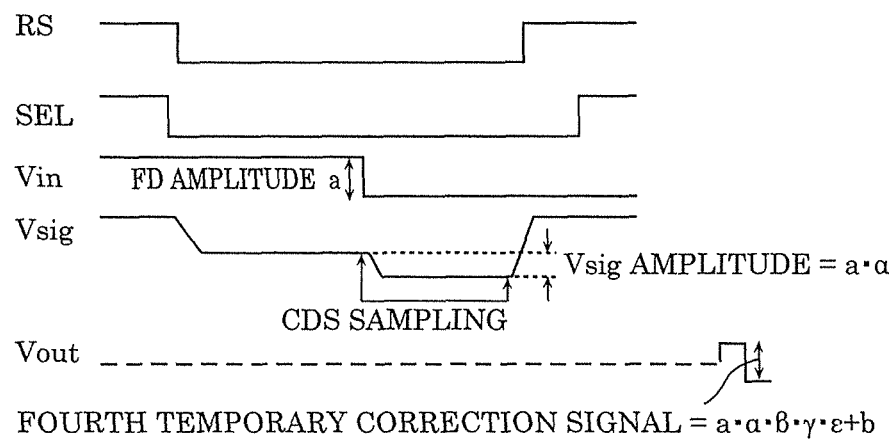
FIG. 8 is a diagram showing an operation performed by the imaging device according to the variation of Embodiment 1.

As shown in FIG. 8, in normal pixel 204, known voltage a is given to reset voltage Vin. A fourth temporary correction signal that is output voltage Vout from output amplifier 206 at this time is represented by the following (Equation 7).

$$\text{Fourth temporary correction signal} = a_2 \cdot \alpha \cdot \gamma \cdot \varepsilon + b' \quad \text{(Equation 7)}$$

A correction signal can be obtained by subtracting the third temporary correction signal from the fourth temporary correction signal, and then dividing the obtained value by known value a.

The processing according to the present variation may be performed instead of the processing described in Embodiment 1. Alternatively, imaging device 200 may have a function of performing both processing operations, and selectively perform either one of the processing described in Embodiment 1 or the processing according to the present variation.

Also, various types of signals in solid-state image sensor 201 described above are controlled by a controller (not shown) included in solid-state image sensor 201 or imaging device 200.

As described above, imaging device 200 according to the present embodiment includes solid-state image sensor 201 including a plurality of pixels 204 that are arranged in a two-dimensional array, and signal processing device 202 that processes an output signal from solid-state image sensor 201. Imaging device 200 generates a corrected image by generating a correction signal based on a difference between a first temporary correction signal and a second temporary correction signal, the first temporary correction signal being obtained by directly applying a first voltage amplitude to a signal storage provided in pixel 204 and the second temporary correction signal being obtained by applying a second voltage amplitude to the signal storage, the second voltage amplitude being different from the first voltage amplitude, acquiring an image signal upon a photographing drive operation being performed by solid-state image sensor 201, and applying the correction signal to the image signal.

Also, as described in the variation of Embodiment 1, the plurality of pixels include normal pixels 204 and OB pixels 204A.

The first temporary correction signal (third temporary correction signal) is obtained by directly applying a constant voltage to a signal storage provided in optical black pixel 204A, and the second temporary correction signal (fourth temporary correction signal) is obtained by directly applying a voltage amplitude corresponding to an optical signal to a signal storage provided in normal pixel 204.

Also, as described in Embodiment 1 and the variation of Embodiment 1, pixel 204 includes reset transistor 204b for resetting the signal storage by an applied voltage that is applied from the outside of pixel 204. Imaging device 200 obtains the first temporary correction signal and the second temporary correction signal (or the third temporary correction signal and the fourth temporary correction signal) by making a change to the voltage applied to reset transistor 204b, with reset transistor 204b being turned on, and calculating a difference in the output signal from the pixel between before and after the change.

Also, processing operations for generating (calculating) a correction signal and the like are performed by, for example, signal processing device 202. These processing operations may be performed partially or entirely by calculator 203.

That is, signal processing device 202 may include a storage device (memory), and may be configured to generate a corrected image by storing a correction signal in the storage device, applying the correction signal stored in the storage device to the image signal, and then output the corrected image to calculator 203.

Alternatively, imaging device 200 may further include calculator 203 that processes an output signal from signal processing device 202, and outputs an image. Calculator 203 may generate a corrected image by applying the correction signal to the image signal when the image signal and the correction signal are input to calculator 203 via signal processing device 202.

Embodiment 2

In recent years, attention has been given to a technique for observing a microstructure by using a CIS (Contact Image Sensing) technique. According to the CIS technique, the observation target is placed so as to be close to the imaging plane of an image sensor. Ordinarily, as the image sensor, a two dimensional image sensor is used in which a large number of photoelectric converters are arranged in rows and columns within the imaging plane. Typically, the photoelectric converters are photodiodes that are formed on a semiconductor layer or a semiconductor substrate, and generate electric charges upon receiving incident light.

On the other hand, an image acquired by the image sensor is defined by a large number of pixels. Each pixel is defined by a unit region including one photoelectric converter. Accordingly, the resolving power (resolution) of the two dimensional image sensor normally depends on the arrangement pitch or arrangement density of the photoelectric converters on the imaging plane. The resolving power determined by the arrangement pitch of the photoelectric converters is called "intrinsic resolving power".

There is an ordinary technique (super-resolution technique) for achieving resolving power that exceeds the intrinsic resolving power of the image sensor, wherein an image of an object is formed by using a plurality of images obtained by shifting the imaging position of the object. However, even if this technique is used, an image acquired by the image sensor is basically dependent on the intrinsic resolving power.

Also, if the arrangement pitch of individual photoelectric converter is reduced almost to the limit of the ordinary semiconductor process technique, it poses a problem of variations induced by transistors and photoelectric conversion elements (photodiodes or photoelectric conversion material) that are disposed within the pixels.

Based on the finding described above, it is an object of the present embodiment to reduce image roughness by using the imaging device according to Embodiment 1 described above, and to, even with the use of an image sensor that has small intrinsic resolving power to cause a problem of pixel variations, provide an image that has a resolution lower than the intrinsic resolving power and little variations.

Figure 9:
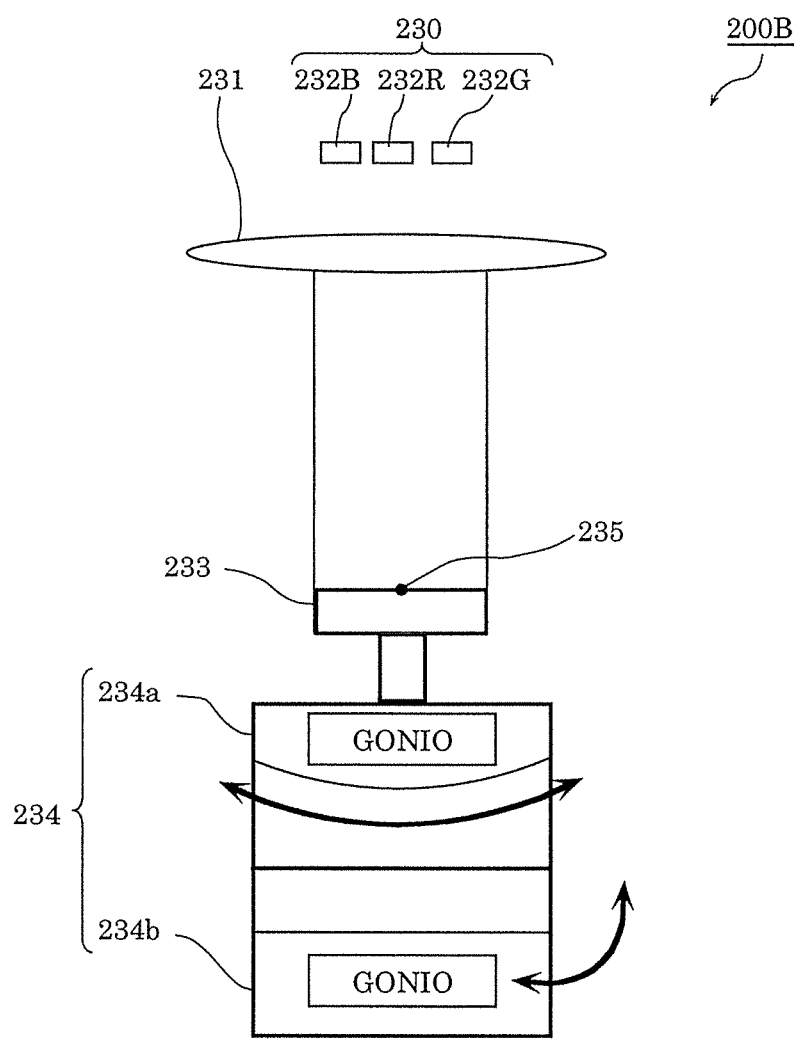
FIG. 9 is a diagram showing an imaging device according to Embodiment 2.

Hereinafter, the details will be described. FIG. 9 is a diagram showing imaging device 200B according to Embodiment 2 for obtaining a resolution smaller than the intrinsic resolving power of solid-state image sensor 201.

Imaging device 200B includes light source 230, collimating lens 231, stage 233, and gonio stage 234. Light source 230 includes green light source 232G, blue light source 232B, and red light source 232R.

Collimating lens 231 converts the light emitted from light source 230 to parallel light. Gonio stage 234 changes the orientation of stage 233. Gonio stage 234 includes gonio stage 234a and gonio stage 234b. Gonio stage 234a rotates about an axis of stage 233 extending in a direction vertical to collimating lens 231. Gonio stage 234b rotates about an axis of stage 233 extending in a direction horizontal to collimating lens 231. Solid-state image sensor 201 is installed at position 235 on stage 233.

Figure 10:
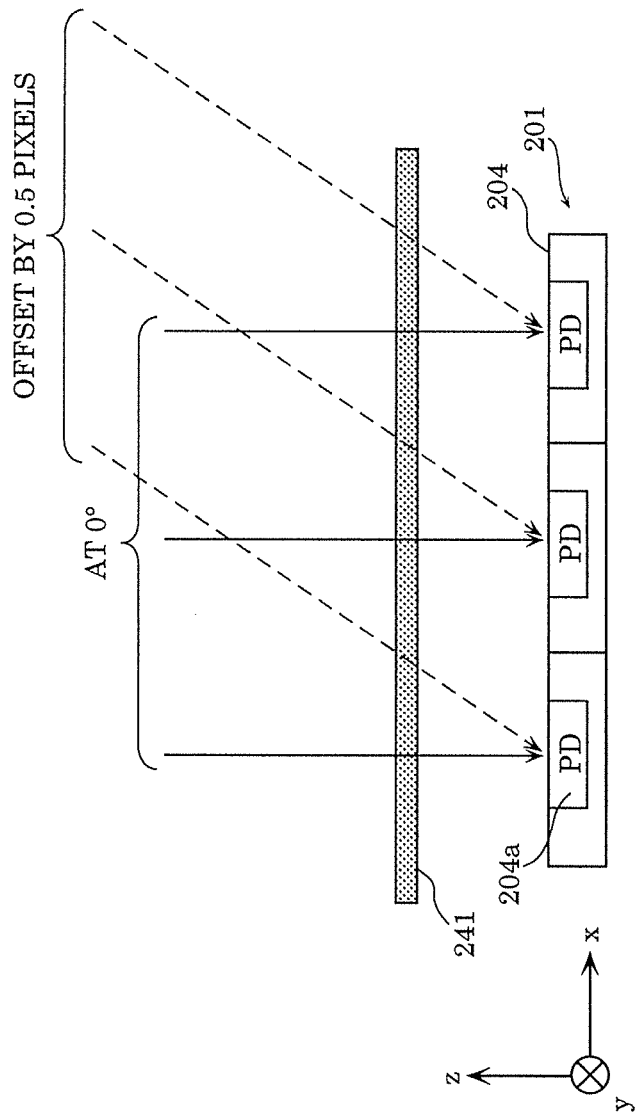
FIG. 10 is a cross-sectional view of a solid-state image sensor according to Embodiment 2.

FIG. 10 is a cross-sectional view of an imaging region (the region where pixels are two-dimensionally arranged) of solid-state image sensor 201. Object 241 is placed so as to be close to pixels 204. Each pixel 204 includes photoelectric converter 204a (photoelectric conversion element). Object 241 and solid-state image sensor 201 are bonded, and for this reason, object 241 cannot be easily removed. The light from light source 230 passes through object 241 and enters photoelectric converters 204a, and an image is thereby obtained.

Figure 11:
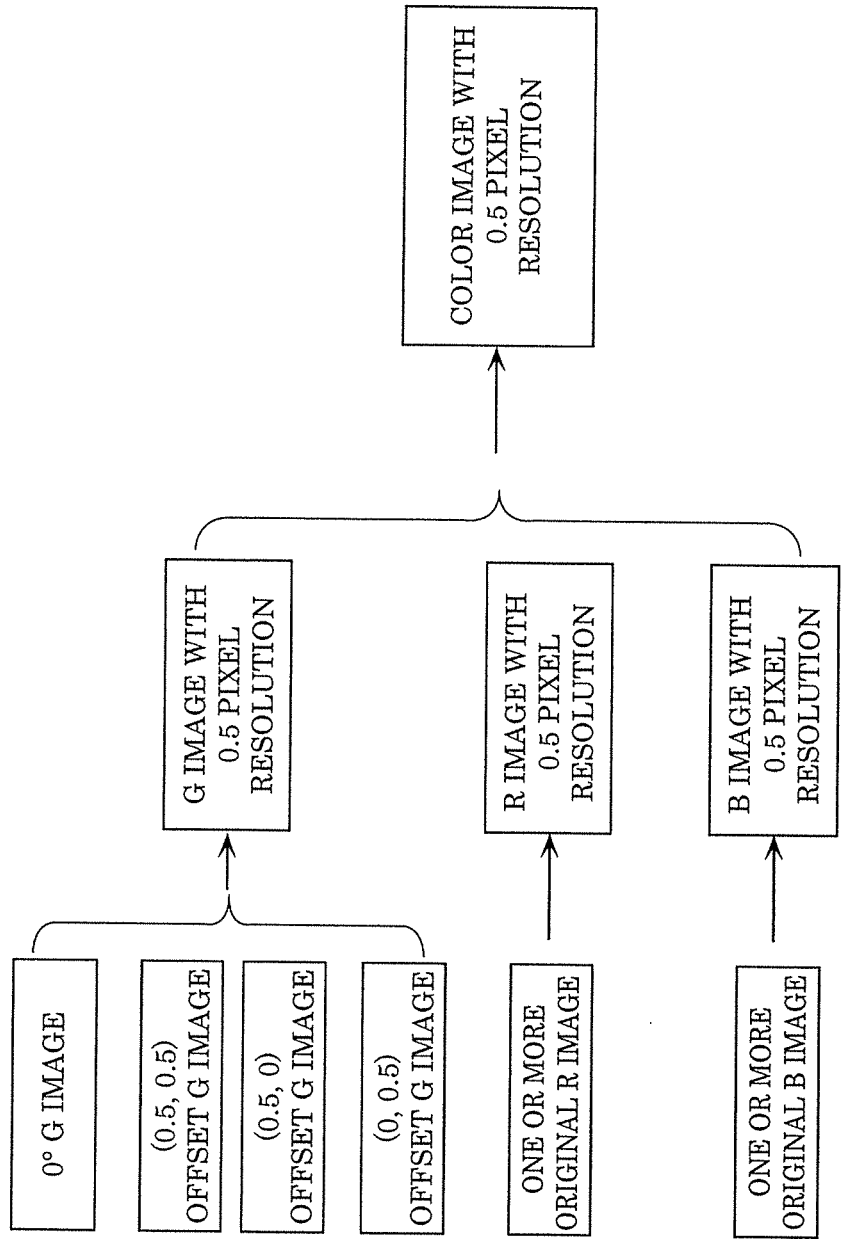
FIG. 11 is a diagram showing an operation performed by the imaging device according to Embodiment 2.

FIG. 11 is a diagram showing an operation performed by imaging device 200B according to the present embodiment. An operation for obtaining a resolution smaller than the intrinsic resolving power of solid-state image sensor 201 will be described with reference to FIGS. 10 and 11.

The operation shown below is controlled by, for example, a controller (not shown) included in imaging device 200B. Also, arithmetic processing operations for various images are performed by, for example, signal processing device 202 or calculator 203.

First, gonio stage 234b moves, and stage 233 is aligned parallel to collimating lens 231. Also, the rotation angle of gonio stage 234a is set to an initial value (the initial value being 0°). In this state, only green light source 232G is illuminated, and an output image is obtained (this image will be referred to as "0° G image").

Next, as a result of rotation of gonio stage 234a, the angle between pixel 204 and light source 230 is changed. Also, the angle is adjusted such that object 241 is projected onto the imaging region by being offset in x direction by an amount equal to half (0.5 pixels) the size of pixel 204. When imaging is performed in this state in the same manner, an image (this image will be referred to as (0.5, 0) G image) is obtained in which object 241 is shifted in x direction by an amount equal to 0.5 pixels from the previous image.

Furthermore, as a result of rotation of gonio stage 234b, the angle is adjusted such that the object is projected by being offset in x direction by an amount equal to 0.5 pixels and in y direction by an amount equal to 0.5 pixels. When imaging is performed in this state, (0.5, 0.5) G image is obtained.

(0, 0.5) G pixel is obtained in the same manner. The order in which these four images are obtained may be set to any order.

Next, the pixels located at the same coordinates in the four images are extracted, and the pixel of (0.5, 0) G image is placed adjacent in x direction to the pixel of 0° G image, the pixel of (0, 0.5) G image is placed adjacent to in y direction to the pixel of 0° G image, and (0.5, 0.5) G pixel is placed obliquely adjacent to the pixel of 0° G image. Then, the set of four pixels (referred to as an identical pixel set) is arranged according to the original pixel position, and thereby G image of 0.5 pixel resolution is obtained.

In the same manner, red light source 232R is illuminated, and R image of 0.5 pixel resolution is obtained. Furthermore, blue light source 232B is illuminated, and image B of 0.5 pixel resolution is obtained. Up to here, it is necessary to perform a total of twelve imaging operations, but the order may be set to any order.

Finally, G image of 0.5 pixel resolution, R image of 0.5 pixel resolution, and image B of 0.5 pixel resolution are combined, and thereby a color image of 0.5 pixel resolution is obtained.

In this step, if there is a variation in each portion in solid-state image sensor 201, as explained in Embodiment 1, image roughness is superimposed on this image as well. To be specific, image roughness with a unit of an identical pixel set is superimposed. That is, there is no image roughness in the identical pixel set, but roughness is superimposed on another identical pixel set.

According to the present embodiment, the image roughness is reduced by the following method.

First, a condition is set in light source 230 and gonio stage 234 so as to image any one of the above images.

Next, a correction signal for each pixel is obtained by imaging device 200 and the driving method according to Embodiment 1.

Next, by sequentially applying the correction signal to each image, image roughness of the color image of 0.5 pixel resolution is reduced.

In the step of obtaining the color image of 0.5 pixel resolution, an imaging operation of imaging the next image may be performed in parallel to performing correction processing. By doing so, it is also possible to reduce the total processing time. Also, here, the description has been given of 0.5 pixel resolution, but this method is also applicable to obtaining an image of ⅓ pixel resolution, or an image of resolution lower than ⅓ pixel resolution.

Variation of Embodiment 2

The present variation provides a method for reducing image roughness caused by quantum efficiency η of photoelectric converter 204a with even higher accuracy by setting a condition in light source 230 and gonio stage 234 shown in FIG. 9 so as to image any one of the images described in Embodiment 2, and obtaining a correction factor.

Figure 12:
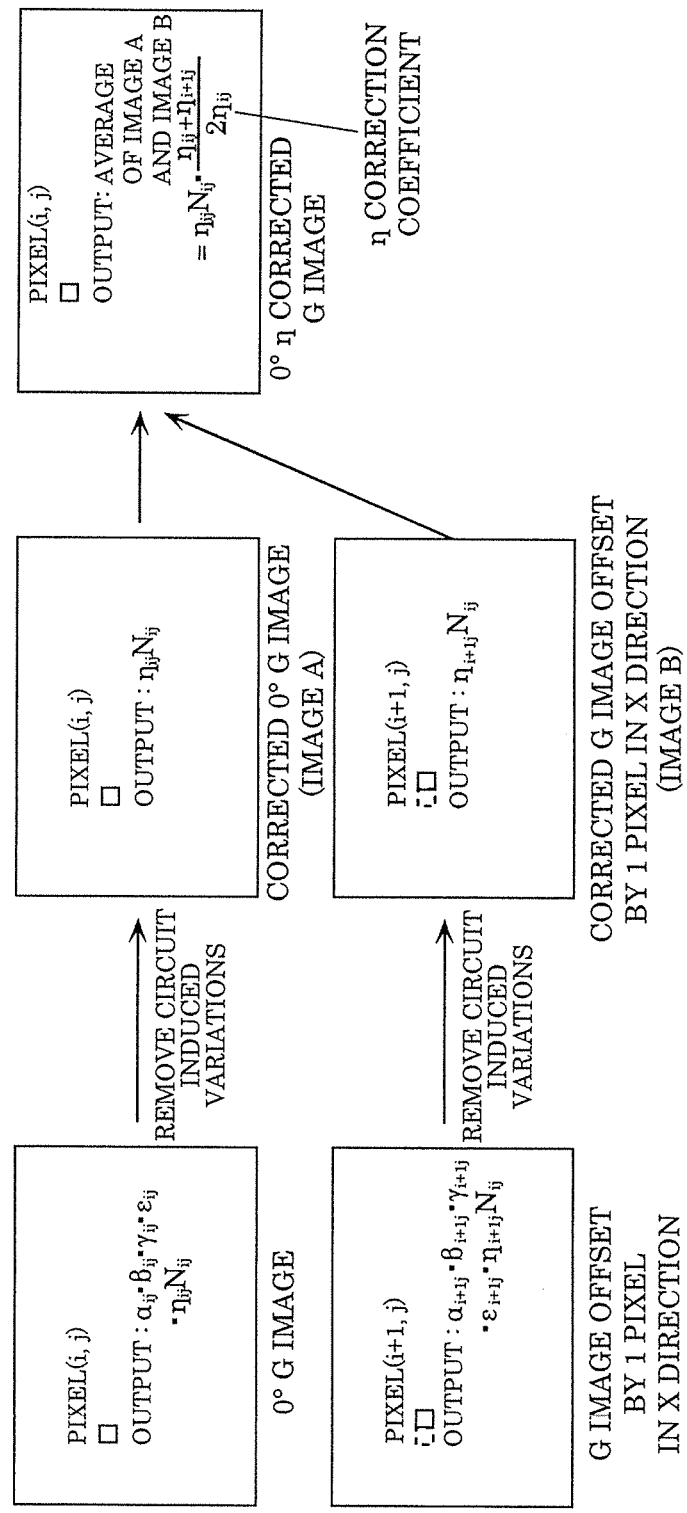
FIG. 12 is a diagram showing an operation performed by an imaging device according to a variation of Embodiment 2.
Figure 13:
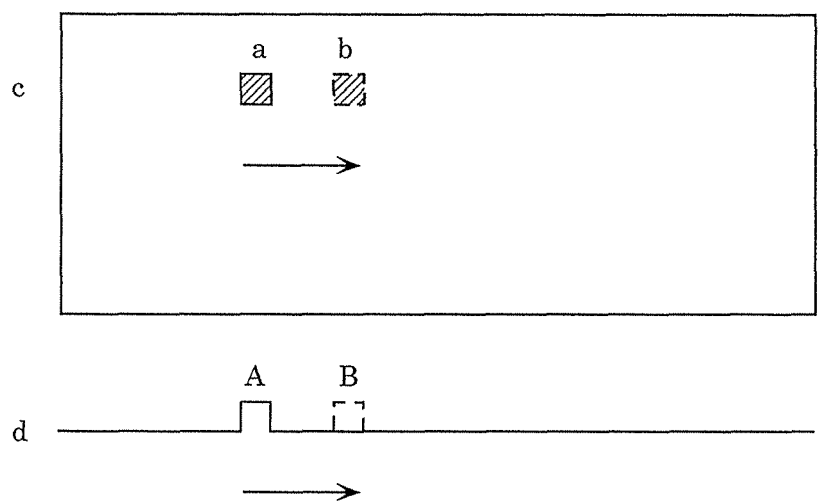
FIG. 13 is a diagram illustrating a conventional technique.

Hereinafter, the details will be described with reference to FIG. 12. In FIG. 12, an example will be shown in which 0° G image is used, but it is also possible to use any other image.

First, 0° G image is imaged. An image obtained by applying the method according to Embodiment 1 to 0° G image is defined as image A.

Next, the angle of gonio stage 234 is set such that object 241 is projected onto solid-state image sensor 201 by being offset in x direction by an amount equal to 1 pixel. Imaging is performed with this setting, and the above-described correction factor is applied to the obtained image. An image obtained in this way is defined as image B.

One pixel (it is assumed that the pixel is located at coordinates (i, j)) in image A is defined as a pixel of interest. Because the correction factor has already been applied, the output signal can be represented by $\eta_{ij} \cdot N_{ij}$. Here, $\eta_{ij}$ is the quantum efficiency of photoelectric converter 204a in pixel (i, j), and $N_{ij}$ is the number of incident photons. On the other hand, the output signal of a pixel at coordinates (i+1, j) in image B can be represented by $\eta_{i+1j} \cdot N_{ij}$ because the number of incident photons is equal to that of pixel (i, j) of image A. The average value of these two pixels is represented by the following (Equation 8).

$$\text{Pixel average value} = (\eta_{ij} + \eta_{i+1j})N_{ij}/2 \qquad \text{(Equation 8)}$$
$$= \eta_{ij}N_{ij} \cdot (\eta_{ij} + \eta_{1+1j})/2$$

If a new image is created by using this average value, the image roughness is reduced as compared with image A and image B. To be specific, the standard deviation of image roughness is reduced to 1/√2.

According to (Equation 8), image A is multiplied by a correction factor of $(\eta_{ij}+\eta_{i+1j})/2$. This will be referred to as η correction factor, and an image obtained by applying η correction factor will be referred to as 0° η corrected G image.

Here, the method for calculating η correction factor by using two images, namely, image A and image B has been described, but η correction factor may be calculated by using more images. For example, η correction factor can be calculated in the same manner by preparing image C with an offset in an amount equal to 1 pixel. In this case, the standard deviation of image roughness is reduced to 1/√3. Furthermore, η correction factor can also be calculated by preparing a predetermined number (the number is represented by M) of images with an offset in x direction or y direction in an amount equal to an integer number of pixels. In this case, the standard deviation of image roughness is reduced to 1/√M.

With the method described above, the image roughness caused by quantum efficiency η of photoelectric converter 204a can also be reduced with even higher accuracy.

As described above, imaging device 200B according to the present embodiment generates a quantum efficiency corrected image by capturing (1) a first image signal obtained by imaging object 241 and (2) a second image signal obtained through photographing performed such that, with respect to object 241 imaged on solid-state image sensor 201 at the time of photographing the object, object 241 is imaged on solid-state image sensor 201 by being moved in a horizontal direction or a vertical direction by an amount equal to an integer number of pixels of 1 or more, calculating a quantum efficiency correction factor by using the first image signal and the second image signal, and applying the quantum efficiency correction factor to an image signal obtained under an arbitrary photographing condition.

Also, imaging device 200B acquires n image signals, where n is an integer of 2 or more, generates a super-resolution image by using the correction signal and the n image signals, after the correction signal has been generated and a first one of the n image signals has been acquired, acquires a second one of the n image signals simultaneously with a step of generating a corrected image corresponding to the first one of the n image signals, and acquires a k-th one of the n image signals simultaneously with a step of generating a corrected image corresponding to a (k−1)th one of the n image signals, where k is an integer from 3 to n.

The imaging devices according to the embodiments of the present disclosure have been described above, but the present disclosure is not limited to the embodiments given above.

For example, the processors included in the imaging devices according to the embodiments described above are typically implemented as LSIs, which are integrated circuits. They may be individual single chips, or a part or all of them may be configured in a single chip.

Also, the method for implementing an integrated circuit is not limited to an LSI, and the integration of a circuit may be implemented by a dedicated circuit or a general-purpose processor. It is also possible to use an FPGA (Field Programmable Gate Array) that can be programmed after LSI production or a reconfigurable processor that enables reconfiguration of the connection and setting of circuit cells in the LSI.

In the embodiments described above, the structural elements may be configured by using dedicated hardware, or may be implemented by executing a software program suitable for the structural elements. The structural elements may be implemented by a program executor such as a CPU or a processor reading and executing a software program recorded in a recording medium such as a hard disk or a semiconductor memory.

Also, the circuit configurations shown in the circuit diagrams given above are merely examples. Accordingly, the present disclosure is not limited to the circuit configurations described above. That is, the present disclosure also encompasses, in addition to the circuit configurations, a circuit that can implement a characteristic function of the present disclosure.

Also, the functional blocks shown in the block diagrams are merely examples. Accordingly, it is possible to implement a plurality of functional blocks as a single functional block, or divide a single functional block into a plurality of blocks. Alternatively, some functions may be transferred to other functional blocks. Also, the functions of a plurality of functional blocks that have similar functions may be processed by single hardware or software in parallel or by time division.

The imaging device according to one or more aspects have been described above by way of embodiments, but the present disclosure is not limited to the embodiments given above. The scope of the one or more aspects may further encompass embodiments obtained by making various modifications that can be conceived by a person having ordinary skill in the art to the above embodiments, as well as embodiments implemented by any combination of the structural elements of different embodiments without departing from the scope of the one aspect of the present disclosure.

Other Embodiments

The present disclosure can be implemented not only as an imaging device, but also as solid-state image sensor 201 or 201A that can be used in the imaging device.

That is, the solid-state image sensor according to the present disclosure is a solid-state image sensor used in an imaging device that generates a corrected image by generating a correction signal based on a difference between a first temporary correction signal and a second temporary correction signal, the first temporary correction signal being obtained by directly applying a first voltage amplitude to a signal storage (although not shown in FIG. 1, a capacitance at the gate of amplifier transistor 204c) provided in pixel 204, and the second temporary correction signal being obtained by applying a second voltage amplitude that is different from the first voltage amplitude to the signal storage, and applying the correction signal to an image signal. The imaging device includes signal processing device 202 that processes an output signal from solid-state image sensor 201 or 201A described above. Furthermore, the solid-state image sensor includes a plurality of pixels 204 that are arranged in a two-dimensional array, and acquires an image signal by performing a photographing drive operation.

By using the solid-state image sensor described above in an imaging device, as with the imaging device described above, it is possible to obtain an image with little variations.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to an imaging device such as a camera.

What is claimed is:

1. An imaging device, comprising:
a solid-state image sensor including a plurality of pixels that are arranged in a two-dimensional array; and
a signal processing device that processes an output signal from the solid-state image sensor,
wherein the imaging device generates a corrected image by:
generating a correction signal based on a difference between a first temporary correction signal and a second temporary correction signal, the first temporary correction signal being obtained by directly applying a first voltage amplitude to a signal storage provided in each of the plurality of pixels, and the second temporary correction signal being obtained by applying, to the signal storage, a second voltage amplitude that is different from the first voltage amplitude;
acquiring an image signal upon a photographing drive operation being performed by the solid-state image sensor; and
applying the correction signal to the image signal.

2. The imaging device according to claim 1,
wherein the plurality of pixels include a normal pixel and an optical black pixel,
the first temporary correction signal is obtained by directly applying a constant voltage to a signal storage provided in the optical black pixel, and
the second temporary correction signal is obtained by directly applying, to a signal storage provided in the normal pixel, a voltage amplitude corresponding to an optical signal.

3. The imaging device according to claim 1,
wherein each of the plurality of pixels includes a reset transistor for resetting the signal storage by using an applied voltage applied from outside of the each of the plurality of pixels, and
the imaging device obtains the first temporary correction signal and the second temporary correction signal by making a change to a voltage applied to the reset transistor, with the reset transistor being turned on, and calculating a difference in an output signal from the each of the plurality of pixels between before and after the change.

4. An imaging device, comprising:
a solid-state image sensor including a plurality of pixels that are arranged in a two-dimensional array; and
a signal processing device that processes an output signal from the solid-state image sensor,
wherein the imaging device generates a quantum efficiency corrected image by:
capturing (1) a first image signal obtained by photographing an object and (2) a second image signal obtained through photographing performed such that, with respect to the object imaged on the solid-state image sensor at a time of photographing the object, the object is imaged on the solid-state image sensor by being moved in a horizontal direction or a vertical direction by an amount equal to an integer number of pixels of 1 or more;

calculating a quantum efficiency correction factor by using the first image signal and the second image signal; and applying the quantum efficiency correction factor to an image signal obtained under an arbitrary photographing condition.

5. The imaging device according to claim 1,
wherein the imaging device
acquires the image signal including n image signals, where n is an integer of 2 or more,
generates a super-resolution image by using the correction signal and the n image signals,
after the correction signal has been generated, and a first one of the n image signals has been acquired, acquires a second one of the n image signals simultaneously with a step of generating a corrected image corresponding to the first one of the n image signals, and
acquires a k-th one of the n image signals simultaneously with a step of generating a corrected image corresponding to a (k−1)th one of the n image signals, where k is an integer from 3 to n.

6. The imaging device according to claim 1,
wherein the signal processing device includes a storage device, and
the signal processing device stores the correction signal in the storage device and generates a corrected image by applying the correction signal stored in the storage device to the image signal, and outputs the corrected image to a calculator.

7. The imaging device according to claim 1, further comprising:
a calculator that processes an output signal from the signal processing device, and outputs an image,
wherein when the image signal and the correction signal are input to the calculator via the signal processing device, the calculator generates the corrected image by applying the correction signal to the image signal.

8. A solid-state image sensor for use in an imaging device,
the imaging device including the solid-state image sensor, and a signal processing device that processes an output signal from the solid-state image sensor, wherein the imaging device generates a corrected image by generating a correction signal based on a difference between a first temporary correction signal and a second temporary correction signal, the first temporary correction signal being obtained by directly applying a first voltage amplitude to a signal storage in each of a plurality of pixels, and the second temporary correction signal being obtained by applying, to the signal storage, a second voltage amplitude that is different from the first voltage amplitude, and applying the correction signal to an image signal, and
the solid-state image sensor including the plurality of pixels that are arranged in a two-dimensional array, and acquiring the image signal by performing a photographing drive operation.

* * * * *